(12) United States Patent
Tracewell

(10) Patent No.: US 7,656,681 B2
(45) Date of Patent: Feb. 2, 2010

(54) VERY LIGHT ENCLOSURE FOR ELECTRONIC SYSTEMS

(75) Inventor: Matthew S. Tracewell, Powell, OH (US)

(73) Assignee: Tracewell Systems, Inc., Lewis Center, OH (US)

( * ) Notice: Subject to any disclaimer, the term of this patent is extended or adjusted under 35 U.S.C. 154(b) by 589 days.

(21) Appl. No.: 11/651,220

(22) Filed: Jan. 9, 2007

(65) Prior Publication Data

US 2007/0223209 A1 Sep. 27, 2007

Related U.S. Application Data

(60) Provisional application No. 60/759,626, filed on Jan. 13, 2006.

(51) Int. Cl.
*H05K 7/14* (2006.01)
*H05K 7/18* (2006.01)
(52) U.S. Cl. .................. 361/800; 361/816; 361/818
(58) Field of Classification Search .......... 361/600, 361/679, 800, 816, 818, 752, 790, 797, 730; 312/223; 174/51, 35 R, 392
See application file for complete search history.

(56) References Cited

U.S. PATENT DOCUMENTS

| 5,528,454 | A  | * | 6/1996 | Niklos ................. 361/695 |
| 5,798,485 | A  | * | 8/1998 | Rohde et al. .......... 174/383 |
| 6,400,568 | B1 | * | 6/2002 | Kim et al. ............ 361/697 |
| 6,610,922 | B1 | * | 8/2003 | Twiss et al. .......... 174/390 |
| 7,492,610 | B2 | * | 2/2009 | Gilliland ............. 361/818 |

* cited by examiner

*Primary Examiner*—Hung S Bui
(74) *Attorney, Agent, or Firm*—Mueller Smith & Okuley, LLC

(57) ABSTRACT

A very light enclosure for electronic systems incorporates a rigid core enclosure structure formed with forward and rearward rigid, zig-zag configured, generally open mesh structure stabilization frames extending between oppositely disposed connection ends. The connection ends are rigidly attached to oppositely disposed sheet metal side assemblies to complete the core enclosure structure. The structure stabilization frames directly support card guides and power supply modules on oppositely disposed sides of a backplane tray.

27 Claims, 15 Drawing Sheets

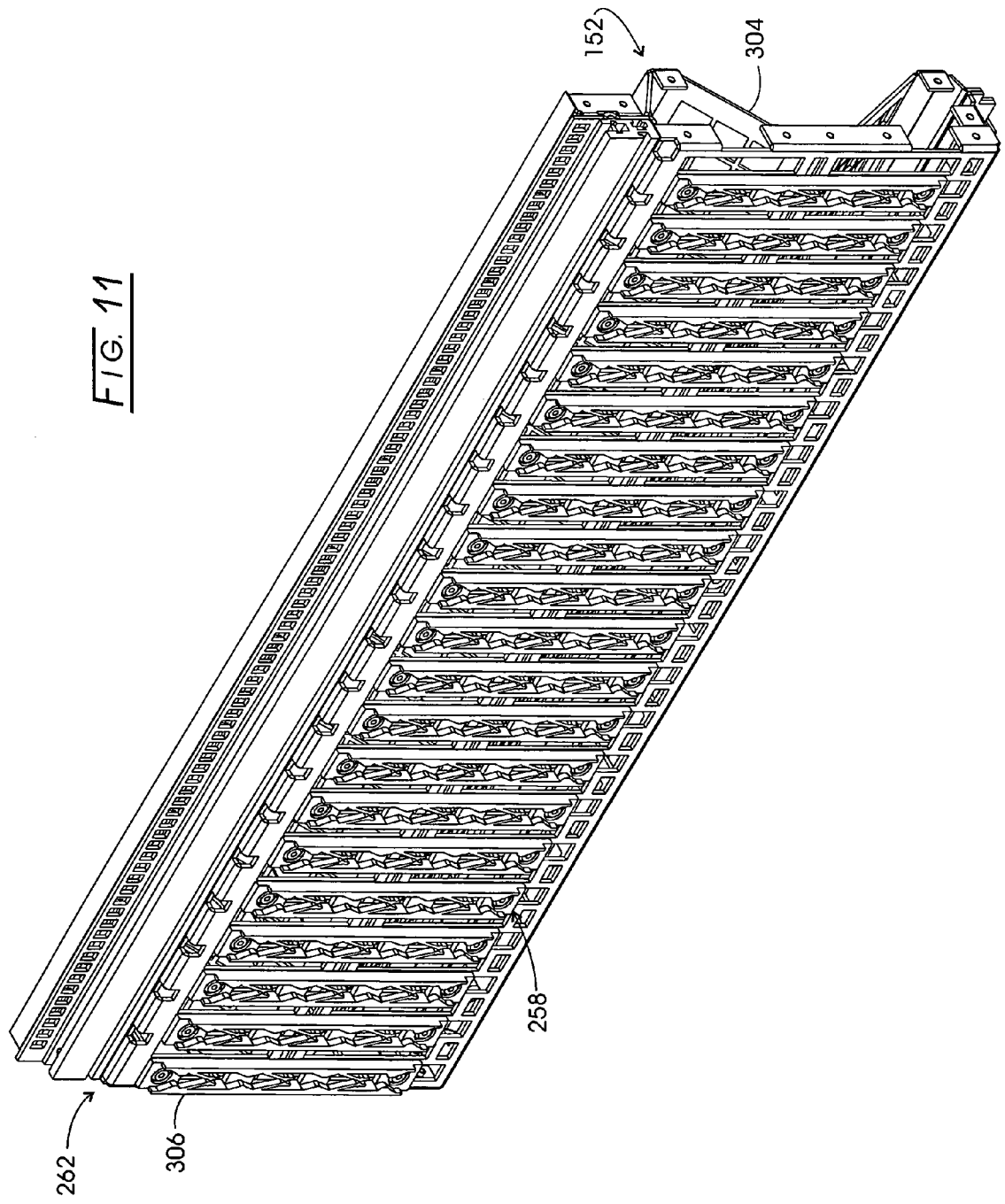

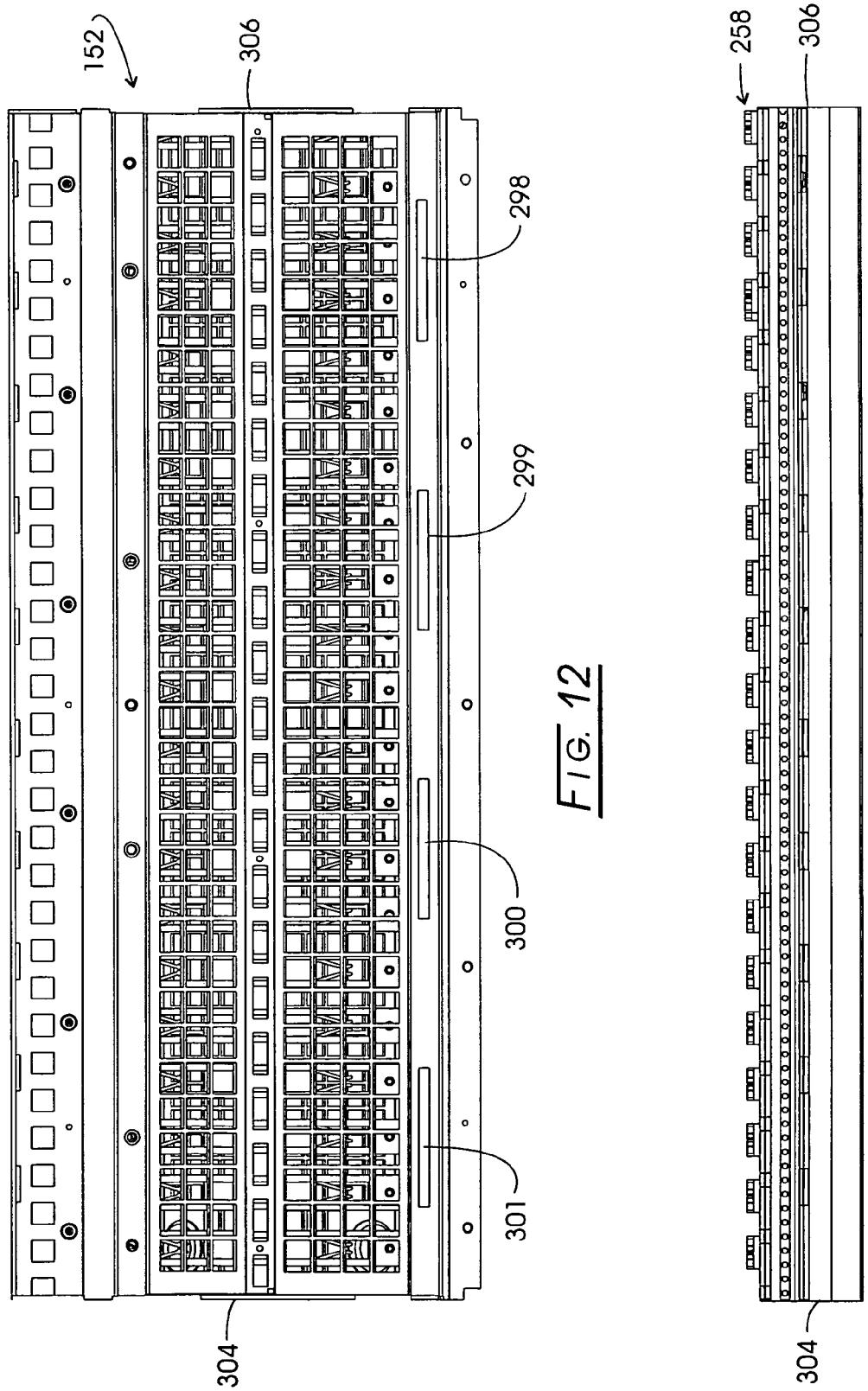

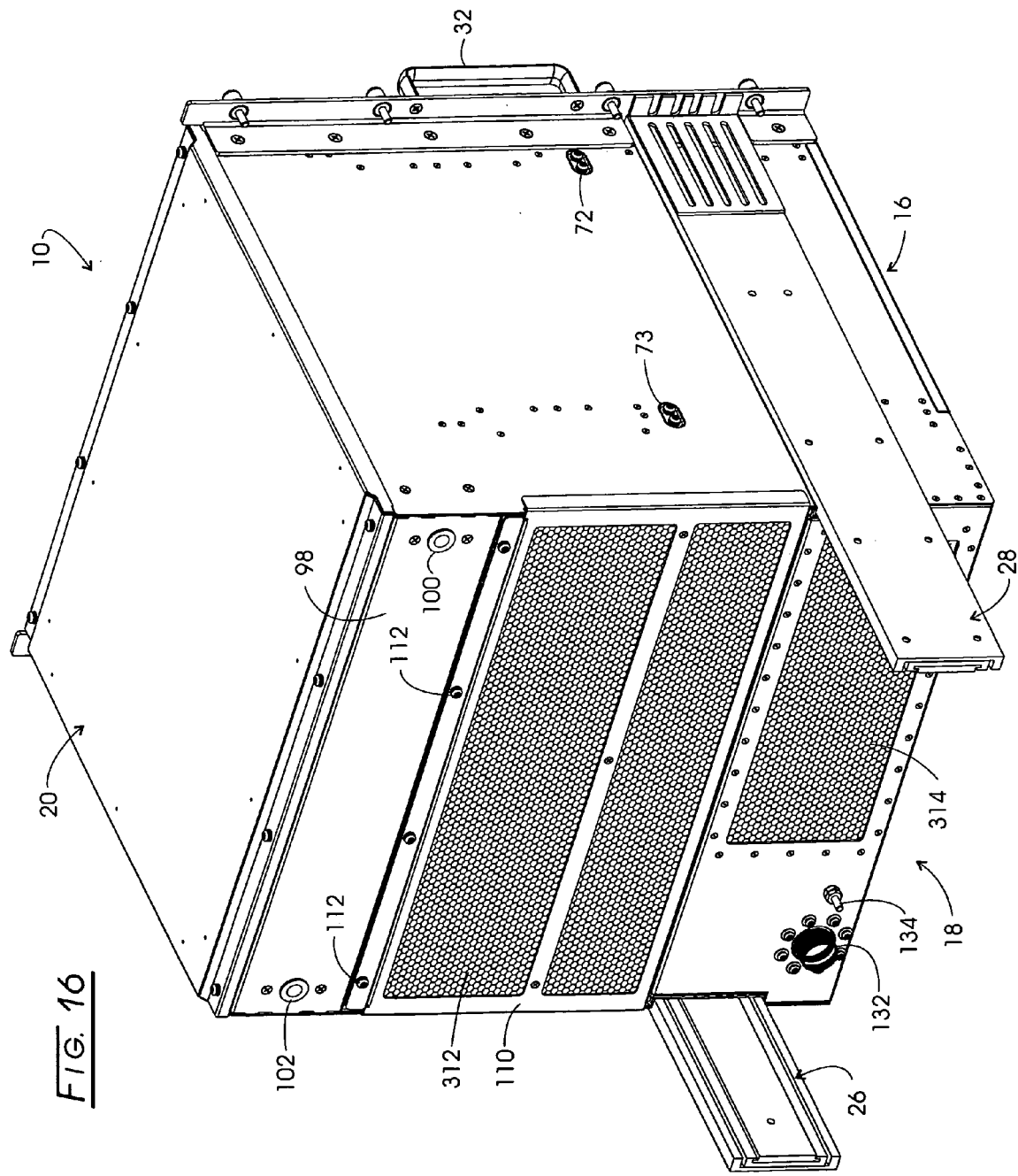

VERY LIGHT ENCLOSURE FOR ELECTRONIC SYSTEMS

CROSS-REFERENCE TO RELATED APPLICATIONS

This application claims the benefit of provisional application 60/759,626 filed Jan. 13, 2006, the disclosure of which is hereby incorporated by reference.

STATEMENT REGARDING FEDERALLY SPONSORED RESEARCH

Not applicable.

BACKGROUND OF THE INVENTION

Complex electronic assemblies traditionally are housed in robust frame structures. With the historic amplification of electronic component densities, discrete functions continue to be maintained but occur in greater and greater numbers within a given enclosure. Typically combined with the enclosures are power supplies necessarily adding to equipment weight and heat generation. Thus, onboard cooling through the medium, for instance, of air is called for notwithstanding the presence of a controlled environment within which the frames are located. Fan-based air cooling management calls, in turn, for directional air flow control.

The carrier of the electronics loaded enclosures in the past have been located and supported at earth surface, and thus, the weight of the enclosure structures, per se, has generally not posed a limitation to their use. However, enclosure weights and functionality now are becoming more and more relevant in a variety of applications. For instance, as higher electronics component density functions are carried upon airborne platforms, the weight of their enclosures become critical. Thus, users of such equipment are seeking enclosures which are substantially lighter while maintaining necessary structural robustness and efficient air cooling capabilities.

BRIEF SUMMARY OF THE INVENTION

The present invention is addressed to a light weight enclosure for electronic assemblies and systems. Such a light weight attribute is achieved while maintaining a very robust and secure structural integrity. The enclosure incorporates an enclosure assembly formed with light weight rigid, arch-like, generally open mesh structure stabilization frames extending between oppositely disposed connection ends. These stabilization frames are fashioned with a generally triangular cross-section having a slightly truncated apex region from which generally flat sides extend to a base region. Such configuration evolves a very rigid structure which not only is light in weight due to its open mesh feature, but also performs as an enclosure cooling air circulation passageway.

The connection ends of two or more spaced apart structure stabilization frames are rigidly fixed to two, oppositely disposed sheet metal side assemblies. Thus, there is defined a rigid structure herein deemed a rigid "core" enclosure structure of four side regions having oppositely disposed access openings which may be covered with removable sheet metal assemblies to complete the enclosure. Preferably, these removable covers are located at the top and bottom of the enclosure.

To provide a card cage feature while conserving enclosure weight, internally disclosed regions of the structure stabilization frames additionally function to support card receiving guides defining a card cage. By mounting air circulation fans, for instance, upon the outwardly disposed base region—of a rearward structure stabilization frame, a forced air circulation arrangement is realized with air exiting through the forward structure stabilization frame assembly.

EMI shielding is accomplished at the structures stabilization frame assemblies with light weight metal honeycomb shields which also provide air passageways in compliment with the open mesh frames.

The enclosures of the invention have been determined to weigh about one half that of competing enclosures.

Other objects of the invention will, in part, be obvious and will, in part, appear hereinafter.

The invention, accordingly, comprises the apparatus possessing the construction, combination of elements and arrangement of parts which are exemplified in the following detailed disclosure.

For a fuller understanding of the nature and objects of the invention, reference should be had to the following detailed description taken in connection with the accompanying drawings.

BRIEF DESCRIPTION OF THE DRAWINGS

FIG. 11 is a perspective front view of the upper rearward structure stabilization frame of the core enclosure structure of FIG. 9;

FIG. 12 is a rear view of the frame of FIG. 11;

FIG. 13 is a top view of the frame of FIG. 12;

FIG. 16 is a rear perspective view of the enclosure of the invention showing the mounting of honeycomb-type EMI shields.

DETAILED DESCRIPTION OF THE INVENTION

Figure 1:
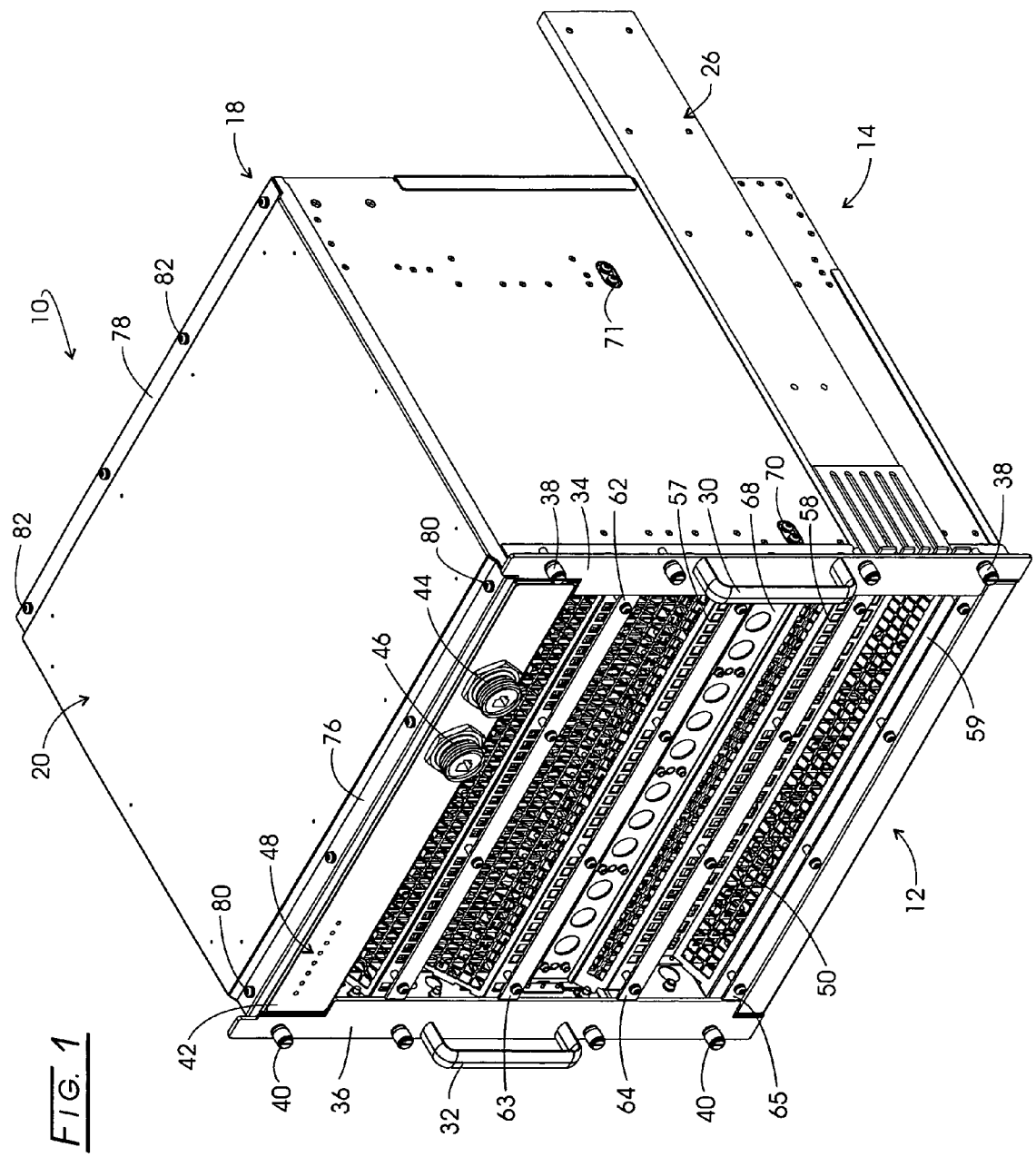
FIG. 1 is a perspective view of an enclosure according to the invention showing its front, top and right side with portions removed to reveal internal structure.

Referring to FIG. 1, a very light enclosure for electronic assemblies is represented in general at 10. Enclosure 10 is dimensioned for utilization within a nineteen inch rack structure and will be seen to be configured at its interior for a VME bus architecture standard. The enclosure is configured with six sides or regions, a front region being shown in general at 12; a right side region being shown generally at 14; a back region being shown generally at 18; and a top region being shown generally at 20. In general, the enclosure 10 is formed of aluminum. Enclosure 10 is slidably mounted within a rack by oppositely disposed three-component slide assemblies, one of which is represented generally at 26 as it is attached to right side sheet metal assembly 14. Maneuvering of the enclosure 10 is by hand graspable handles 30 and 32 which, in turn, are fixed to respective attachment angles 34 and 36. When inserted within a rack, four screws at attachment angle 34, certain of which are revealed at 38 are threadably engaged with the rack. Similarly, four such screws, certain of which are identified at 40 attached at angle 36 are threadably engaged with the retaining rack. A top plate 42 is seen extending across the upper portion of front region 12. Plate 42 supports two communication ports (comports) 44 and 46 as well as an array of light emitting diodes (LEDs) represented generally at 48 which function to provide visual system status cues.

When enclosure 10 is fully assembled, the front region 12 will be covered with a honeycomb-type EMI shield. However, to reveal internal structure the shield is removed in the instant figure to reveal a forward, rigid, zig-zag, generally open mesh structure stabilization frame represented generally at 50. Structure stabilization frame 50 is formed principally of open mesh metal (aluminum) and its generally triangular cross-section evolves a three-dimensional arrangement achieving the substantial strength and stiffness required to support components forming a card cage assembly a backplane tray and power supply modules in the interior of enclosure 10. The term "triangular" is used herein in a general sense. For instance, such general cross-sectioning may be developed asymmetrically to conform with the dimensions of supported parts such as fans. Arbitrarily designating the truncated apices of such triangular cross-section to be inwardly directed, then the base region endings are shown in the instant figure. In this regard, four horizontally disposed such base end regions are shown at 56-59. Each of these base end regions 56-59 are seen to support stand-off retained honeycombed EMI shield retaining plates identified respectively at 62-65. Slightly below the middle of the front region 12 is a horizontally disposed backplane tray alignment pin support plate 68. Plate 68 is configured with weight lightening holes and is retained in position by paired screws. That backplane tray assembly is retained in position, inter alia, by paired screw assemblies, for example, at right side assembly 14 identified at 70 and 71. The figure also reveals that top assembly 20 is retained against front region 12 and back region 18 by top retainer brackets 76 and 78 which, in turn, are fastened to the unit by four screws, certain of which are revealed respectively at 80 and 82.

Figure 2:
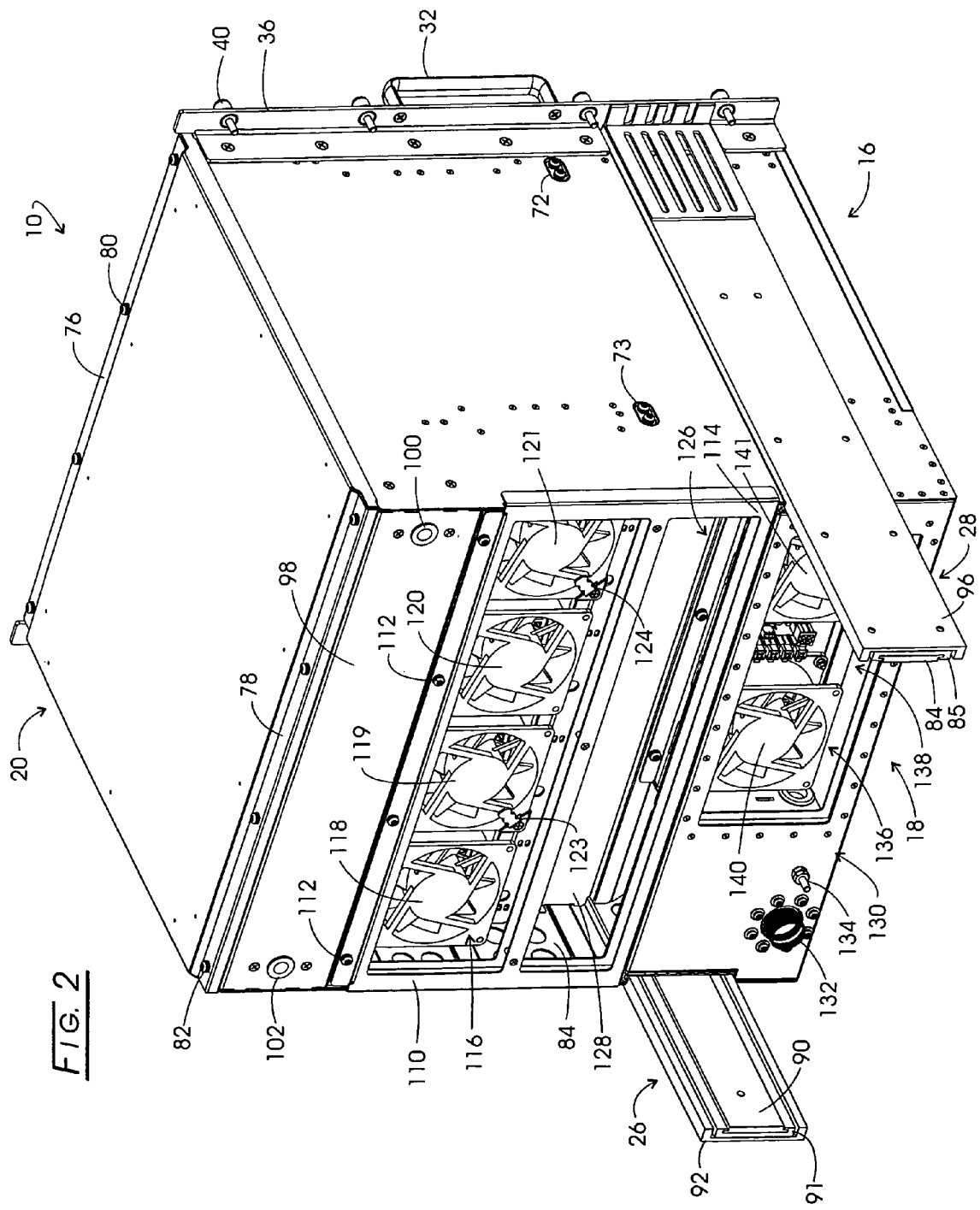
FIG. 2 is a rear perspective view of the enclosure of the invention showing its back side, left side and top and having portions removed to reveal internal structure.

Looking to FIG. 2, back region 18 is revealed in more detail in conjunction with left side or region 16 and top assembly 20. The figure reveals backplane securement paired screw assemblies 72 and 73 which correspond to screw assemblies 70 and 71 at right side region 14. It may be observed that paired screw assemblies 72 and 73 are engaged with a surface inside the outer surface of left side assembly 16, a similar arrangement may be noted with respect to screw assemblies 70 and 71 as described in connection with FIG. 1. This is because they are engaged with an inner lightened sheet metal (aluminum) component. In this regard, a portion of such a component with respect to right side 14 is shown in the instant figure at 84. Three-component slide assembly 26 reappears in FIG. 2 and the components thereof are seen at 90-92. Of these components, component 90 is fixed to enclosure 10 while outer component 92 is coupled to the supporting rack and intermediate component 91 provides for sliding interaction. A similar grouping of three components is shown at 94-96 in conjunction with slide assembly 28.

Now looking to the back region 18, at the upper portion thereof there is a top panel 98 which supports spaced apart rack receptors 100 and 102. When enclosure 10 is moved into its secure position within a rack, bullet-nose pins engage the receptors 100 and 102. Those pins are sometimes referred to as shock pins.

Below panel 98 is a panel frame 110 which is upwardly retained against the enclosure 10 by screws certain of which are shown at 112. The bottom of frame 110 at frame portion 114 is configured with tabs (not shown) which engage a sequence of slots. In use, the frame 110 retains an EMI shielding honeycomb component which is removed in the figure to reveal internal structure. In this regard, as seen at the upper portion of frame 110, there is a four circulation fan tray represented generally at 116 which retains card cage cooling fans 118-121. Air temperature sensors 123 and 124 are shown attached to respective air circulation fans 119 and 121. In this regard, the fans 118-121 may be controlled with respect to temperature. Below the circulation fan tray 116 there is shown to be a chamber represented generally at 126 which functions as an opening for accessing or positioning a horizontally disposed backplane tray. That backplane tray is located forwardly of an air blocker 128.

A lower back plate assembly is represented generally at 130 which is seen to support a circular power input connector 132. Adjacent connector 132 is a ground stud 134. Back plate 130 further functions to define a lower chamber represented generally at 136 which incorporates a rearwardly disposed frame intended for supporting a honeycomb-type EMI shield which has been removed in the instant figure to illustrate internal structure. That internal structure includes a fan tray represented generally at 138 incorporating two power supply air circulation fans 140 and 141.

Figure 3:
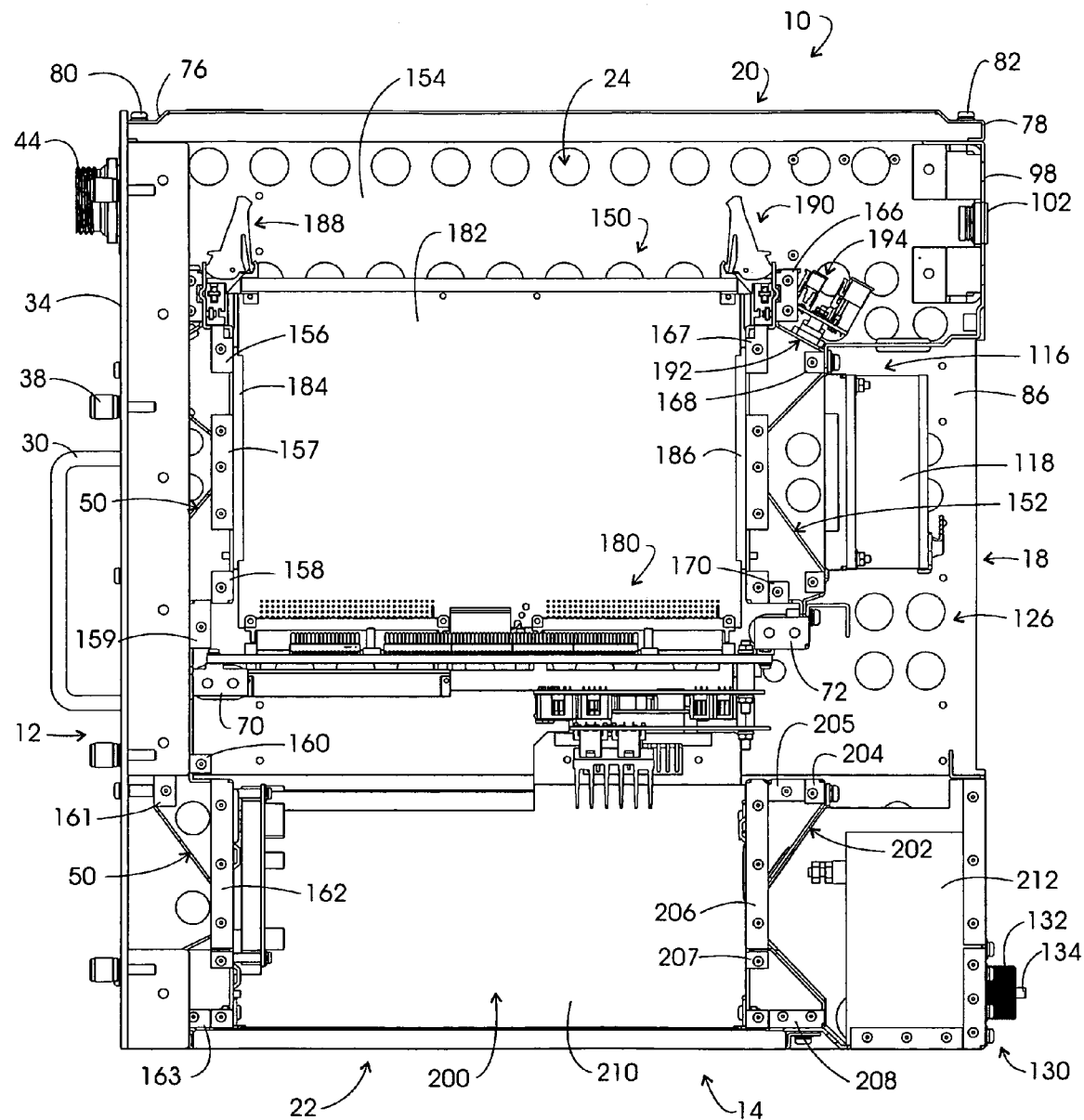
FIG. 3 is a right side view of the enclosure of FIG. 1 with its right side removed.

Referring to FIG. 3, enclosure 10 is illustrated looking through its right side 14, bottom side or region 22 being identified. The interior region of enclosure 10 is identified generally at 24 and is seen to incorporate an upwardly disposed card cage region represented generally at 150. Region 150 is generally established between the upwardly disposed portion of forward structure stabilization frame 50, portions of which are again are identified by that numeration and an upwardly disposed portion of a rearward, rigid, zig-zag configured, generally open mesh structure stabilization frame represented generally at 152. Each of the structure stabilization frames as at 50 at 152 extend between connection ends. Those ends are formed with brackets rigidly fixed to the inner and outer sheet metal components of sides 14 and 16. In this regard, the inner component for the right side has been described in connection with FIG. 2 at 84. In similar fashion, the inner component of the left side of enclosure 10 is represented at 154. The sheet metal (aluminum) inner components are formed with lightening or weight reducing holes or round openings. The forward connection ends of structure stabilization frame 50 are fixed to connection brackets. In this regard, forward connection end bracket components are seen, inter alia, at 156-163. In similar fashion, fixed to structure stabilization frame 152 are rearward connector end bracket components certain of which are identified at 166-170. Connection with the right side 14 is shown to be by rivets, certain of the patterns of which are revealed in FIG. 1. Other fastening approaches, for example, by laser welding are contemplated to provide a rigid coupling. The lower boundary of the card cage region 150 is defined by a backplane tray assembly represented generally at 180. Assembly 180 is retained in position, inter alia, by screw pairs and associated tray mounted brackets 70 and 71. Note that screw pair and bracket assembly 70 is vertically off-set from that at 71 to facilitate manipulation of the backplane tray 180.

A computer card is represented at 182 operatively connected with the backplane of backplane tray 180 and retained by oppositely disposed card guides 184 and 186. Note that these card guides are fixed respectively to the truncated apices of forward structure stabilization frame 50 and rearward structure stabilization frame 152. Cards such as that at 182 are locked or released by injector/ejector assemblies, two of which are represented generally at 18.8 and 190. Note that the rearwardly disposed truncated apices of rearward structure stabilization frame 152 are configured in non-symmetrical zig-zag form to provide for their support mounting to card cage circulation fan tray 116. A non-open mesh portion of structure stabilization frame 152 is shown at 192. Portion 192 functions both as a circulation air deflector and to support a fan control module represented generally at 194.

Located below the backplane tray 180 is a power supply region represented generally at 200. Region 200 extends between the lower portion of structure stabilization frame 50 and a second rearward rigid, zig-zag configured, generally open mesh structure stabilization frame represented generally at 202. As with the other structure stabilization frame components, frame 202 extends between rearward connection ends. In the figure, the rightward connection end is seen to be configured with rearward connector end bracket components, certain of which are identified at 204-208. As before, brackets as at 202-208 are rigidly connected to the right side assembly, for example, by rivets. Other approaches such as laser welding may be contemplated for this connection. Shown within the region 200 is a power supply 210. Additionally seen in FIG. 3 is a line filter 212 associated with power input connector 132.

Figure 4:
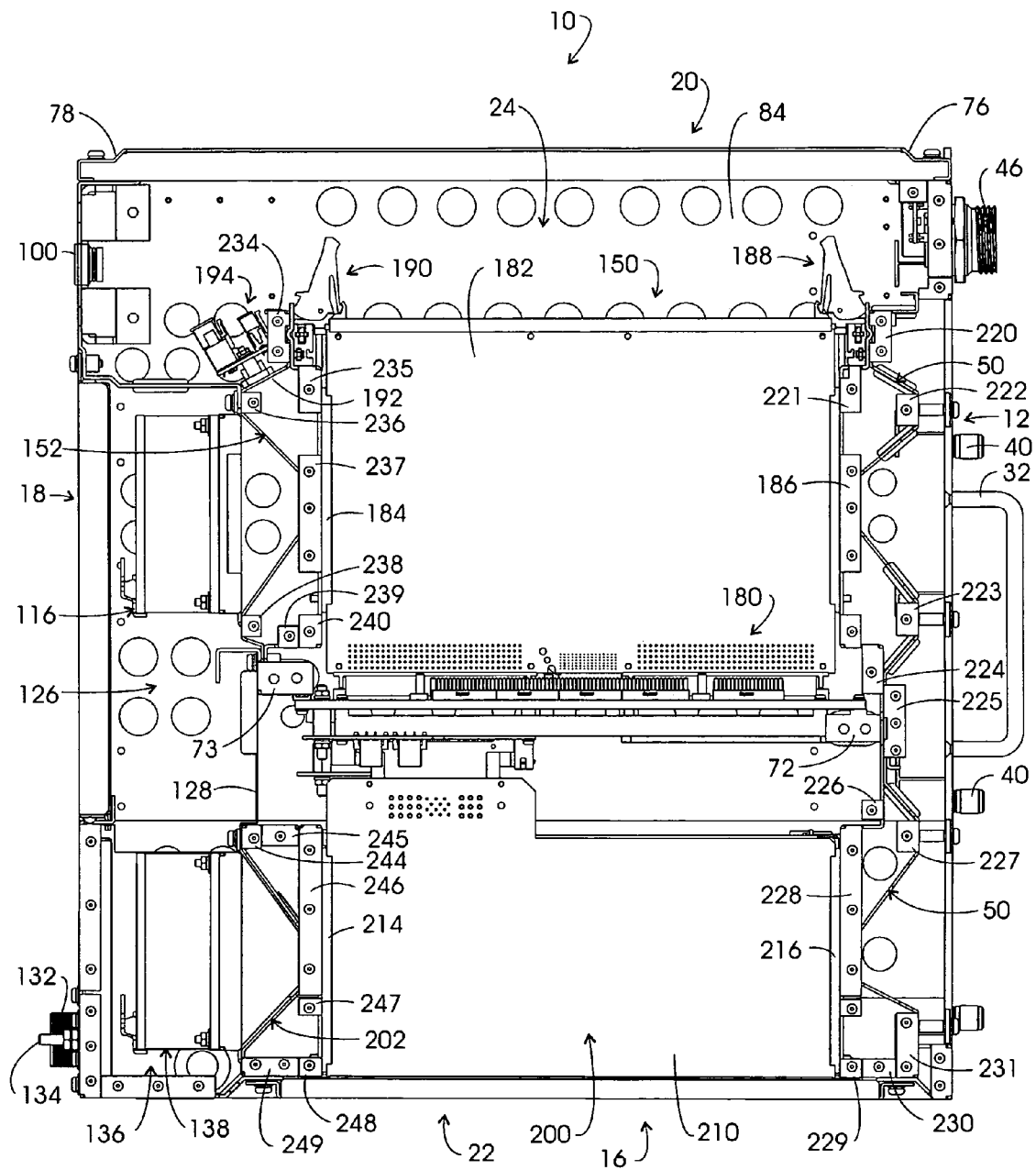
FIG. 4 is a left side view of the enclosure of FIG. 1 with its left side removed.

Referring to FIG. 4, a view of the enclosure 10 from the left side 16 and with that side removed is presented. In the figure, card cage region 150 reappears as well as lower power supply region 200 disposed respectively above and below backplane tray 180. The figure reveals forward connection end bracket components which are affixed to left side assembly 16. Certain of these bracket components are represented at 220-230.

In similar fashion, certain of the upwardly disposed rearward connection end bracket components for structure stabilization frame 152 are identified at 234-239 and the corresponding bracket components of structure stabilization frame 202 are seen at 244-249.

The opposite side of computer card 182 is illustrated as well as that of power supply 210. Additionally seen in the figure are fan trays 116 and 138.

Figure 5:
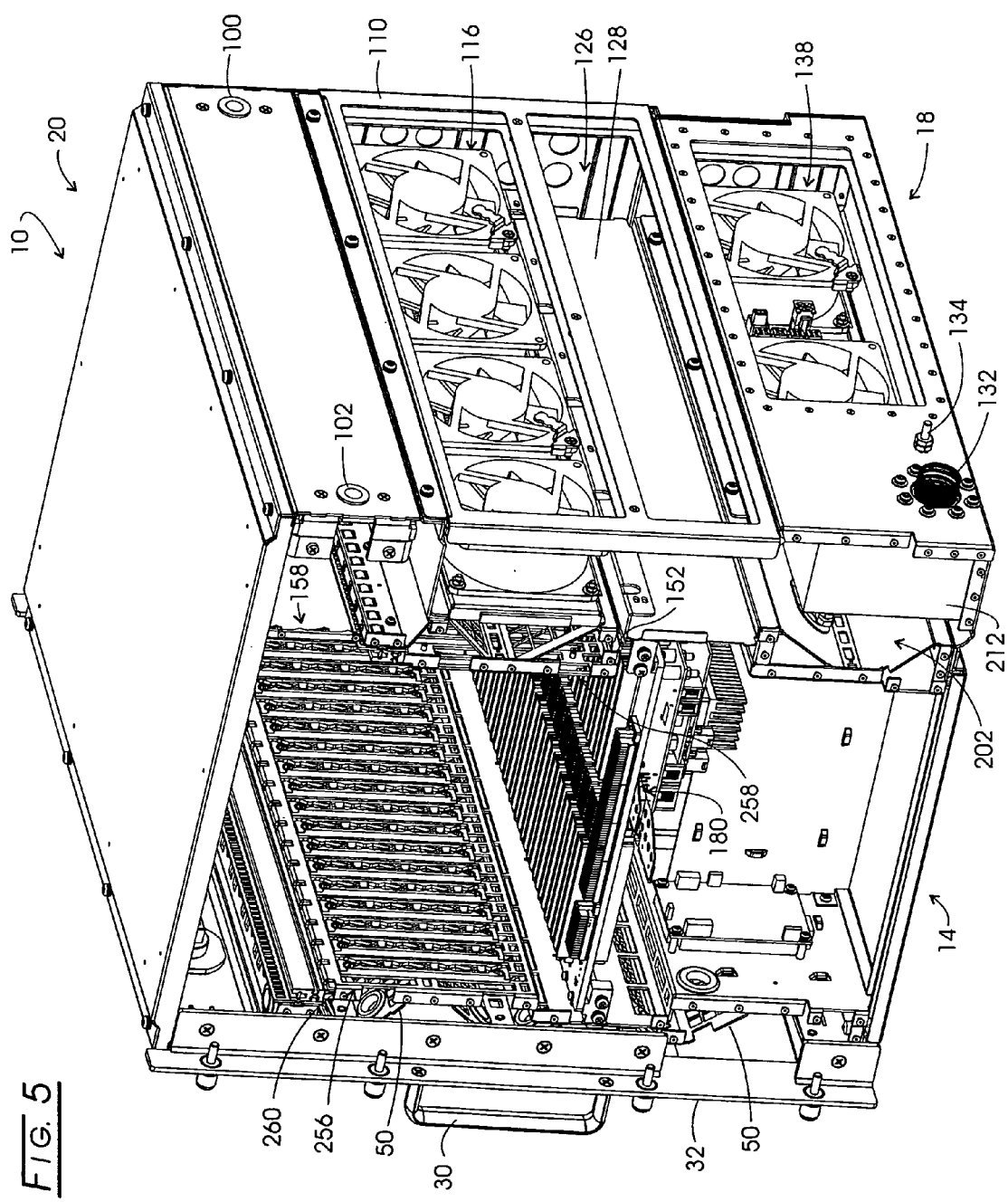
FIG. 5 is a rear perspective view of the enclosure of FIG. 1 with its right side removed and having components removed to reveal internal structure.
Figure 6:
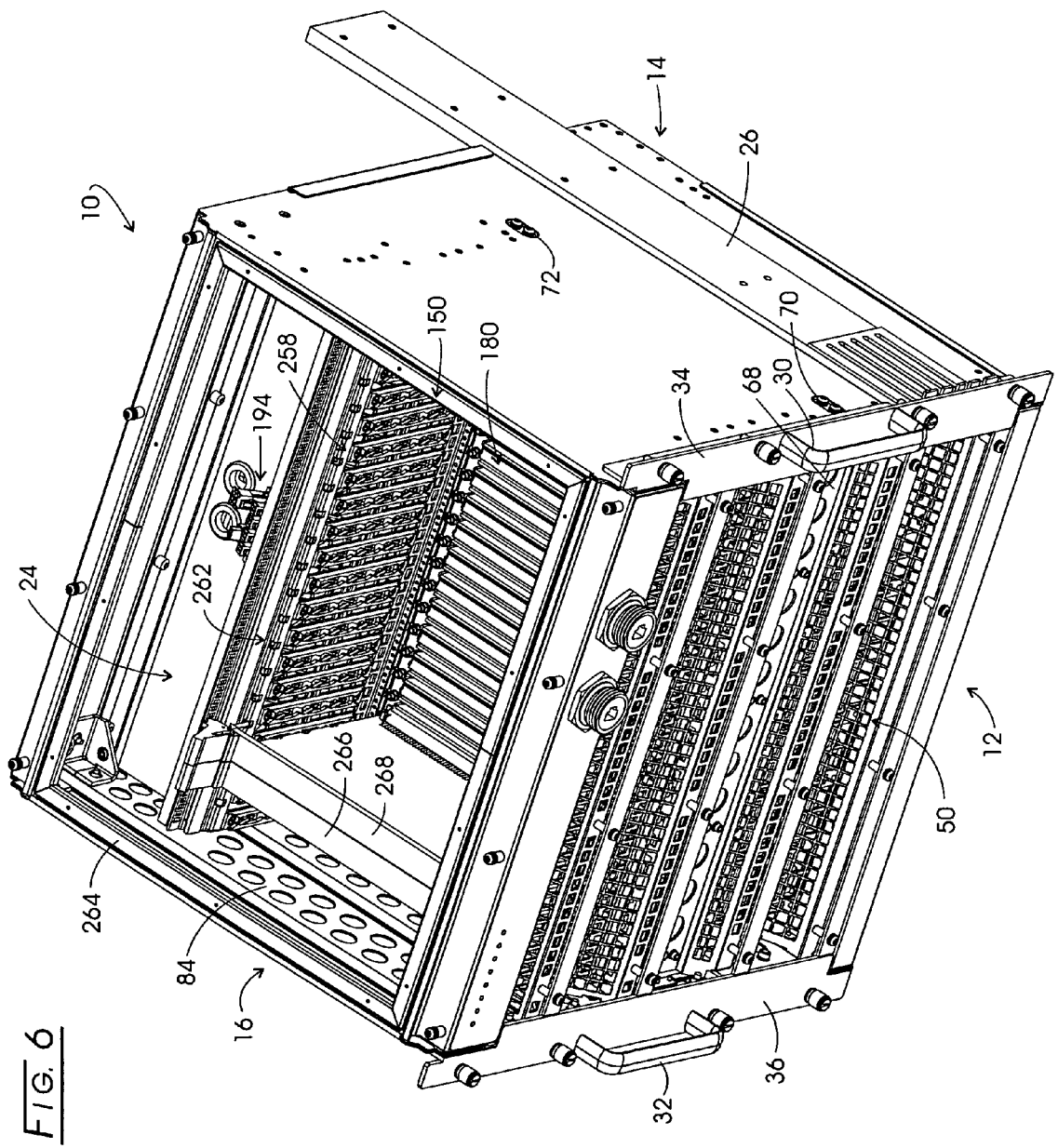
FIG. 6 is a top perspective view of the enclosure of FIG. 1 with its top side removed and having components removed to reveal internal structure.
Figure 7:
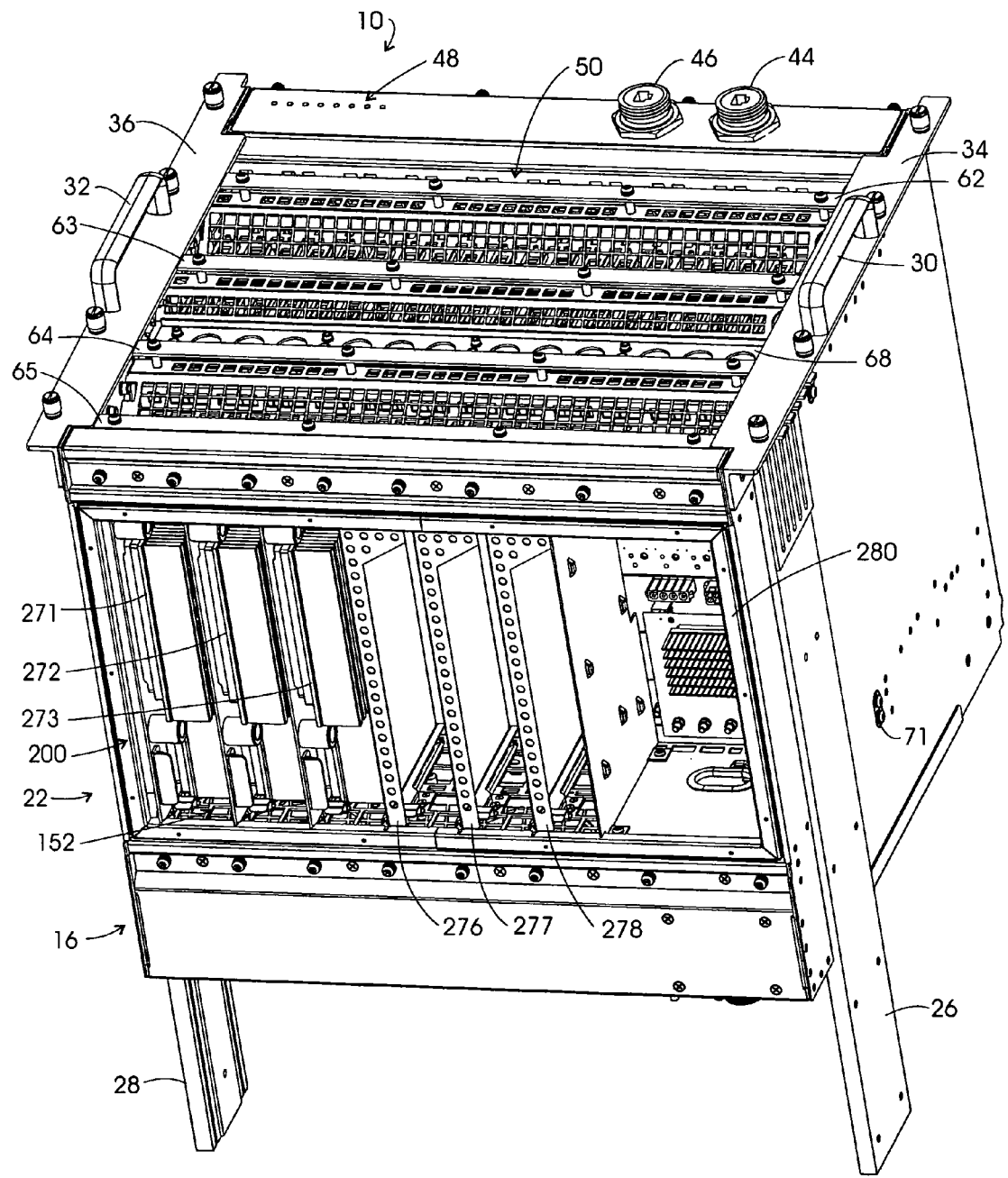
FIG. 7 is a bottom perspective view of the enclosure of FIG. 1 with its bottom side removed and having components removed to reveal internal structure.

FIGS. 5-7 illustrate the enclosure 10 at a relatively high level of detail, particularly showing the very light but very rigid structurally robust generally open mesh structure stabilization frames. Looking to FIG. 5, a rear perspective view of enclosure 10 is presented with the removal of the right side assembly 14. In the figure, the forward structure stabilization frame again is represented in general at 50. The apices of the triangular or zig-zag open mesh structures are revealed as being so positioned as to support a vertical array of forward card guides represented generally at 256. The backplane tray again is represented in general at 180 and a portion of the rearward upper open mesh zig-zag structured stabilization frame again is represented in general at 152 as supporting a vertical array of rearward card guides represented generally at 258. Note, as represented in general at 260, there is located an array of notch-like injector/ejector positions at frame 50. At the rear region 18, honeycomb type EMI shield retaining frame 110 reappears as located over card cage circulation fan tray 116 and chamber 126 the forward position of which is shown identified at air blocker 128. A portion of the lower structure stabilization frame 202 is revealed as well as the power supply fan tray as represented at 138.

Looking at FIG. 6, another perspective view of enclosure 10 is provided wherein a covering portion of the top assembly 20 has been removed. Within the interior region 24, the backplane tray 180 is observable in conjunction with the vertical array of rearward card guides 258. Note that injector/ejector positions adjacent the components of the array 258 are represented in general at 262. As a component of the top 20, an inside attachment flange is illustrated at 264. That flange supports a gasket. Two computer cards 266 and 268 are shown mounted within the card cage region 150.

Turning to FIG. 7, enclosure 10 is illustrated again in perspective fashion but with the principal portion of the bottom 22 removed. Structure stabilization frame 50 reappears with honeycomb-type EMI shield retention plates 62-65. Three power supply cards or modules 271-273 are shown mounted within the lower power supply region 200. In general these power supplies are provided as 800 watt modules with a system requirement of providing 3 volts, 5 volts and plus or minus 12 volts. To assure that proper air circulation pressure is directed into the comb-like heat sinks of these power supplies, each of the three remaining empty power supply slots are provided with airflow blockers 276-278. Bottom assembly 22 is configured in the same manner as top assembly 20. In this regard, shown in FIG. 7 is an inside attachment flange 280 forming a component of the bottom assembly. A gasket is supported with the flange 280.

Figure 8:
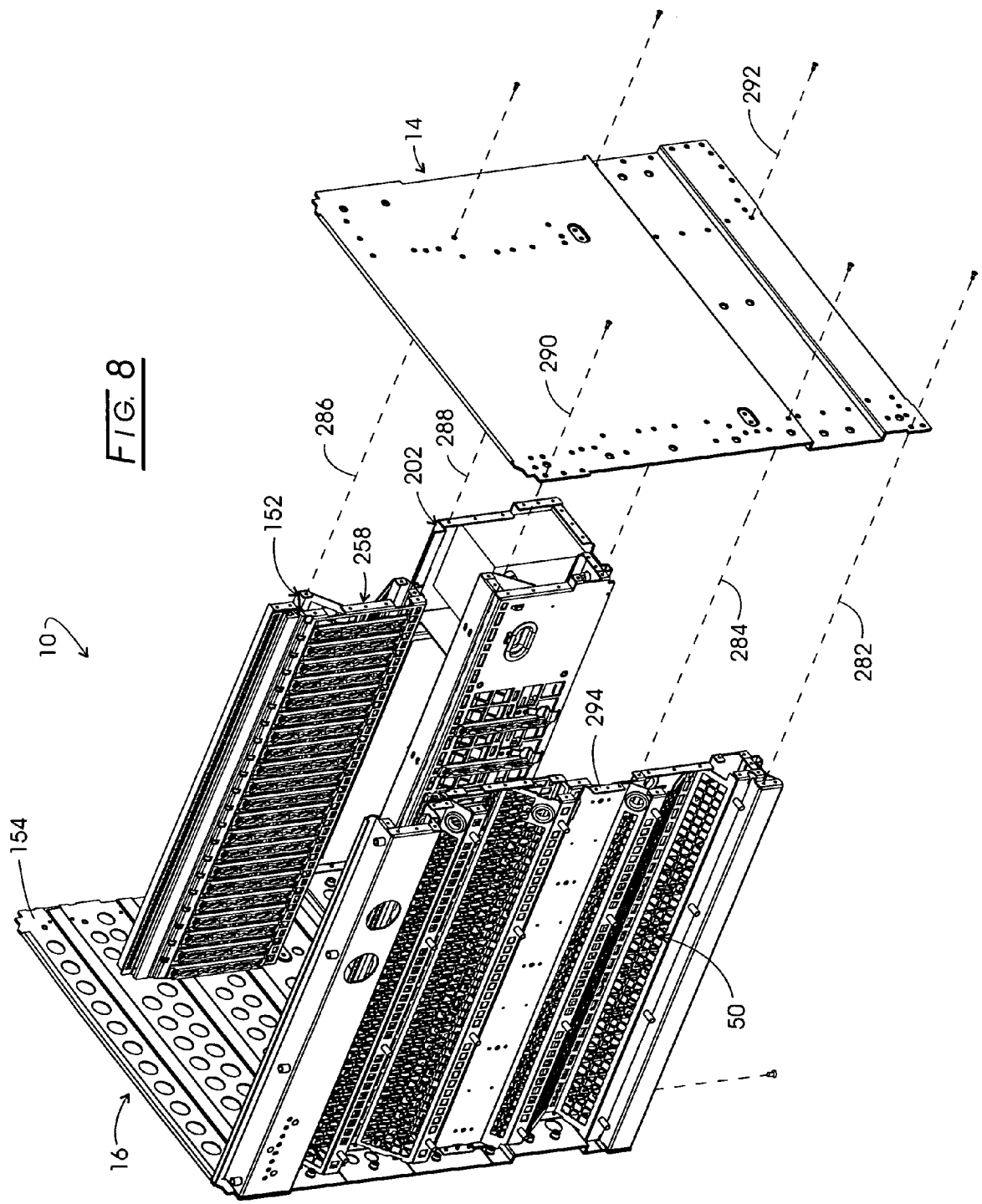
FIG. 8 is a partially exploded view of the rigid core enclosure structure of the enclosure of FIG. 1.
Figure 9:
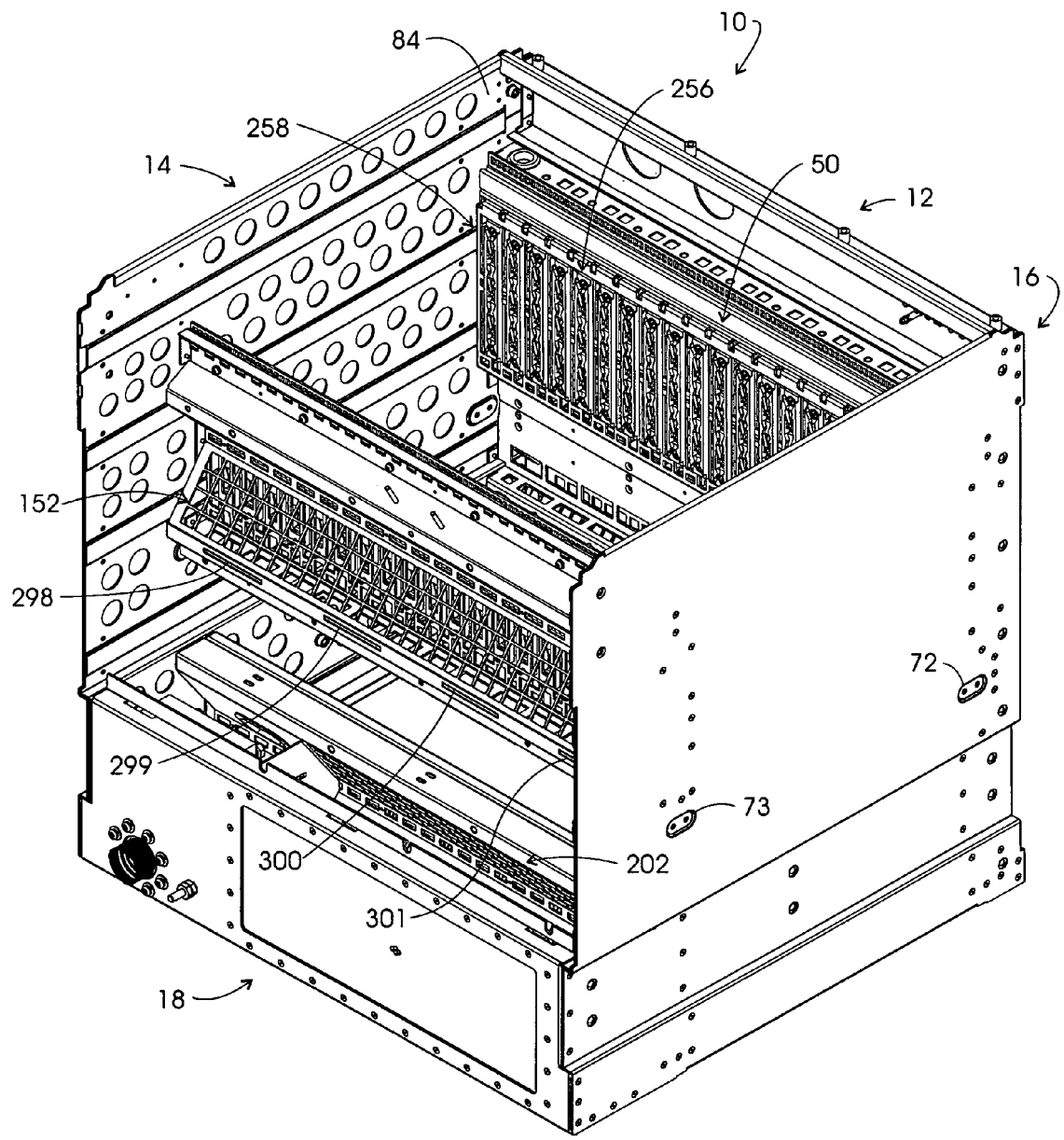
FIG. 9 is a perspective view of the rigid core enclosure structure of the enclosure of FIG. 1.

The combination of a rigid, zig-zag configured generally open mesh structure stabilization frame when rigidly fixed, as by rivets or laser welding to two sides of the enclosure 10, defines a rigid core enclosure structure of four sides. It is from this core structure that the electrical or electronic system components ultimately are supported or "hung". FIGS. 8 and 9 illustrate that rigid core enclosure structure. In the somewhat exploded rendition of FIG. 8, the forward rigid, zig-zag configured generally open mesh structure stabilization frame again is identified in general at 50. Also seen in the figure is the interior plate 294 coupled with and made part of frame 50 to which backplane alignment pin support plate 68 as described in connection with FIG. 1 is attached. Frame 50 is seen rigidly attached to left side assembly 16. Two traced rivet locations with respect to the sheet metal assemblage 14 are shown at 282 and 284. In similar fashion, the upper rear, rigid zig-zag configured generally open mesh structure stabilization frame 152 is seen to be rigidly fixed to the left side sheet metal assemblage 16. Spaced below the frame 152 is the lower rigid, zig-zag configured generally open mesh structure stabilization frame 202. By virtue of this spacing between the two frames, rear access with the backplane tray is provided. Frame 202 also is rigidly fixed to left side sheet metal assembly 16. The rigid rivet based coupling of the right connection end of frame 152 is represented in the figure by traced rivet locations 286 and 288. Similarly, two traced rivet locations with respect to rearward lower frame 202 are seen at 290 and 292.

FIG. 9 provides a perspective rear view of the core enclosure structure. In the figure, the sheet metal (aluminum) right and left side assemblies 14 and 16 are shown in rigid connection with open mesh forward structure stabilization frame 50; rearward upper structure stabilization frame 152; as well as rearward lower structure stabilization frame 202. This core assembly achieves light weight with robust and rigid structural benefits. Observable in the frame 152 are slots 298-301 within which the earlier-described tabs of upper frame 110 are inserted. Returning momentarily to FIG. 2, by removing screws as at 112 holding frame 110, the entire frame 110 may be pivotally opened about the tab and slot arrangement.

Figure 10:
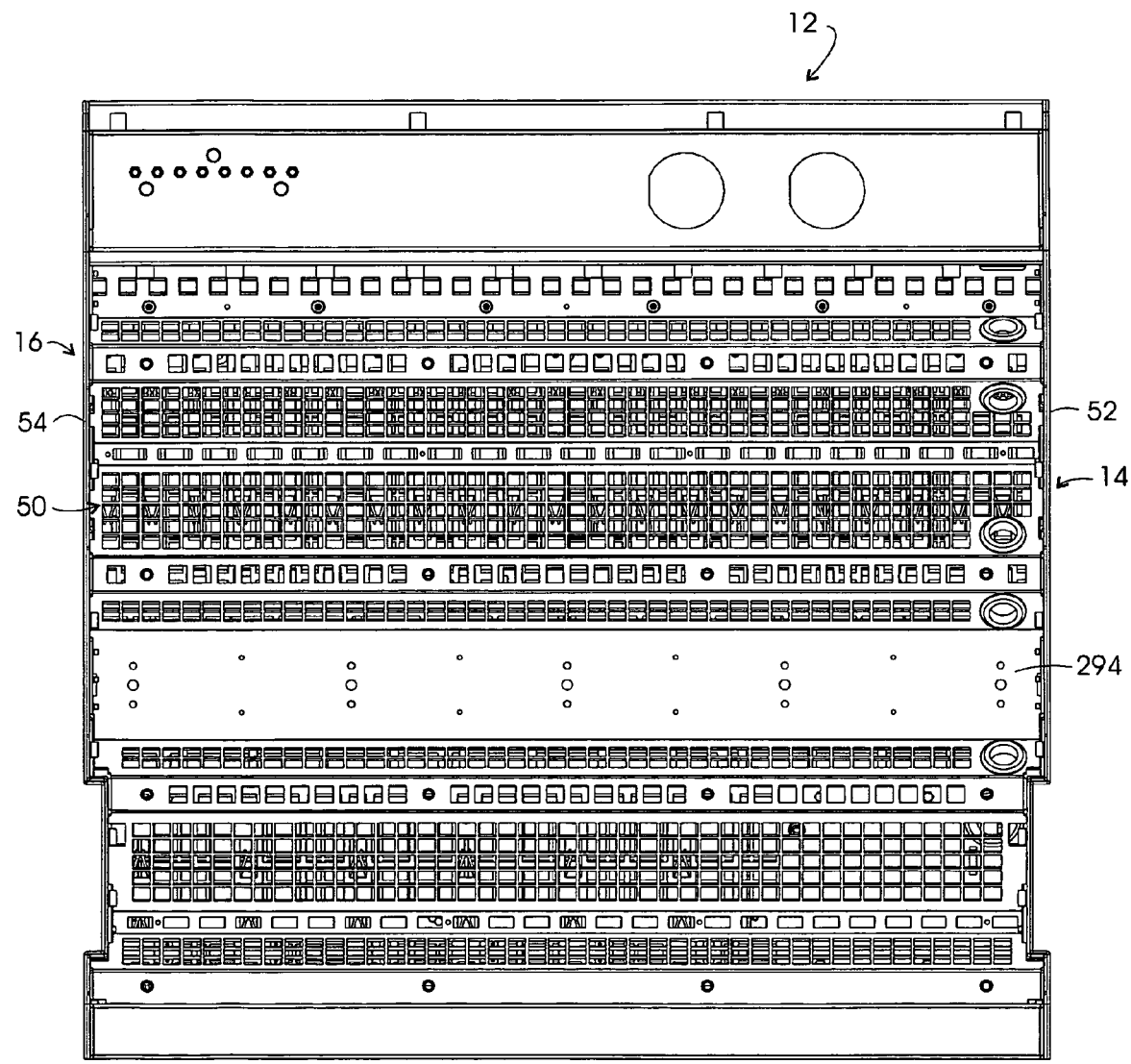
FIG. 10 is a front view of the core enclosure structure of FIG. 9.

FIG. 10 is a front view of the core enclosure structure shown in FIG. 9, the view showing the rigid, zig-zag configured generally open mesh structure stabilization frame 50 as well as the earlier-described plate 294. In general, the structure stabilization frame 50 extends between connection ends 52 and 54.

FIG. 11 presents a perspective view of the upper rearward structure stabilization frame 152. Shown in the figure is the array of card guides 258 as well as notch-shaped injector/ejector positions as represented in general at 262. As is apparent from this drawing, structure stabilization frame 152 is quite light and the zig-zag stabilization configuration is very rigid to securely support the array of card guides 258.

Looking to FIG. 12, a rear view of the structure stabilization frame 152 is provided. The very light open mesh structure as it extends between connection ends 304 and 306 is illustrated. Additionally, earlier-described slots 298-301 are revealed.

Referring to FIG. 13, a top view of the structure stabilization frame 152 is presented. The width of the frame evolved by the zig-zag or triangular cross-section arrangement of the structure becomes apparent.

Figure 14:
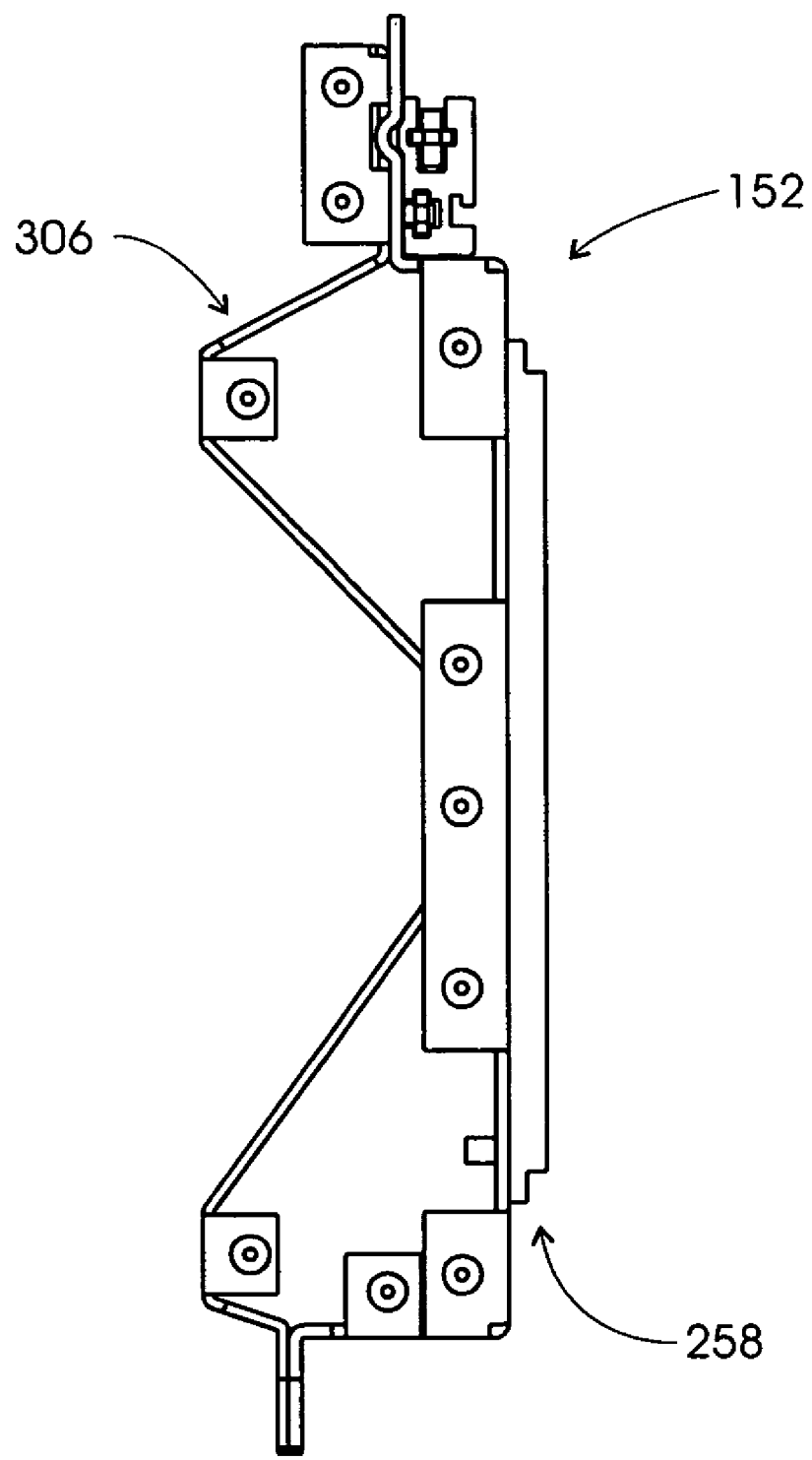
FIG. 14 is a left end view of the frame of FIG. 11.

Referring to FIG. 14, the left connection end 306 of the structure stabilization frame 152 is presented. It may be observed that while the zig-zag configuration of the structure is apparent, when considered from a triangular cross-sectional viewpoint, the triangular structure is not symmetrical. Thus the terms "generally triangular" are employed herein. This arrangement reveals a flexibility in design intended to meet component position requirements. For example, the somewhat truncated apices of the triangular-shape or shapes are located to accurately support circulation fan tray 116 (FIG. 2).

Figure 15:
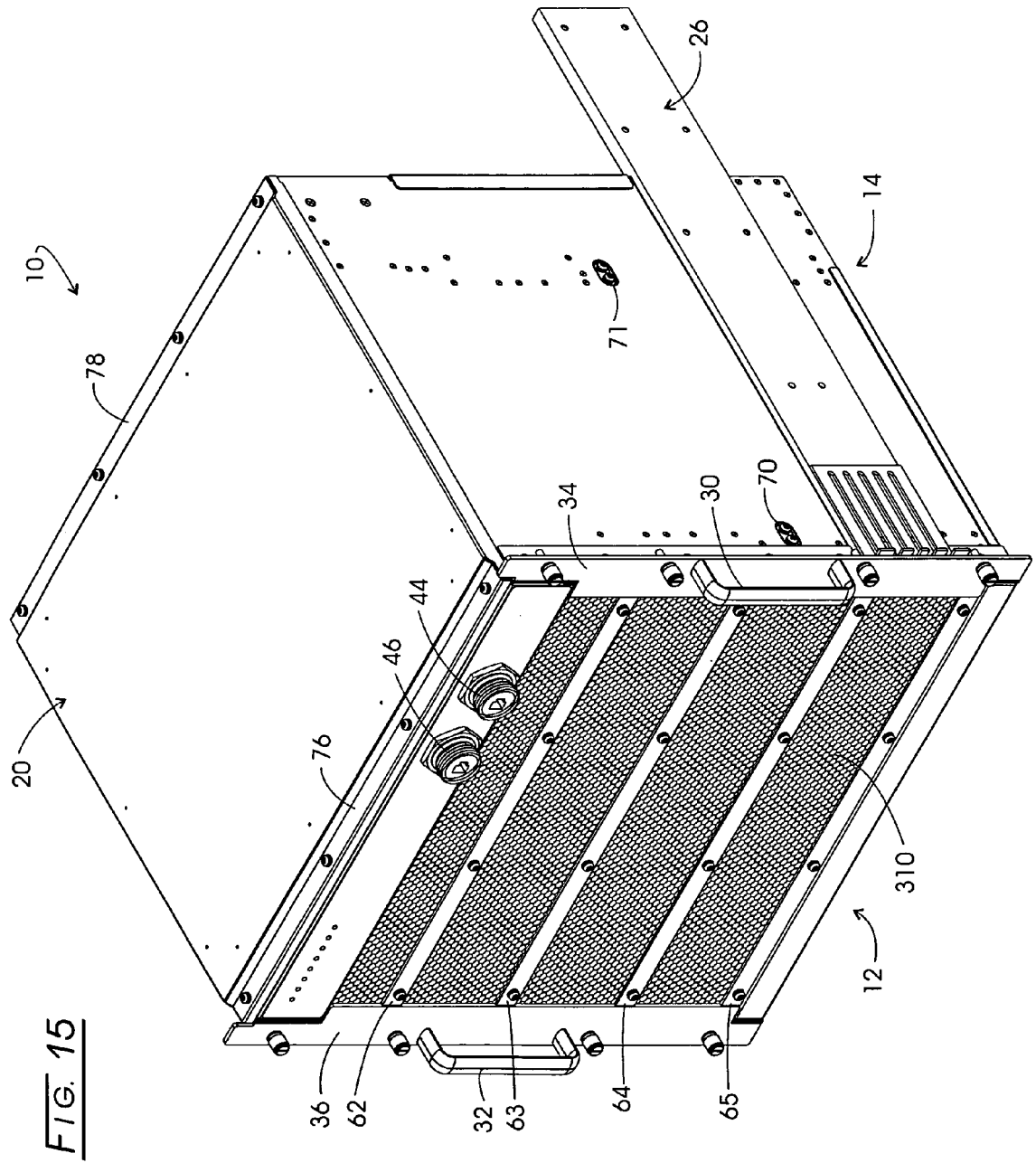
FIG. 15 is a front perspective view of the enclosure of the invention showing the mounting of a honeycomb-type EMI shield.

EMI shielding is provided outwardly of all of the open mesh structure stabilization frames. Looking to FIG. 15, enclosure 10 is seen to be provided with such a metal honeycomb EMI shield at 310. Shield 310 is retained in position by the earlier-described honeycomb retention plates 62-65 which are retained in position by the illustrated screws in conjunction with standoffs (FIG. 1). Of particular advantage, the honeycomb-type shield 310 is in airflow communication with the underlying structure stabilization frame both with respect to card cage region 150 and power supply region 200 (FIG. 3).

Looking to FIG. 16, frame 110 is seen retaining a honeycomb-type EMI shield 312. This arrangement provides shielding for the structure stabilization frame 152. As before, not only is such EMI shielding provided, but also the honeycomb structure 312 is in airflow communication with the upwardly disposed fan tray 116 (FIG. 2) and the corresponding upwardly disposed structure stabilization frame 152 (FIG. 11).

The figure also reveals that the lower structure stabilization frame 202 (FIG. 3) is covered by a honeycomb implemented EMI shield 314. This open honeycomb structure 314 also is in airflow communication with fan tray 138 (FIG. 5), structure stabilization frame 202 (FIG. 4), and lower power supply region 200.

Since certain changes may be made in the above apparatus without departing from the scope of the invention herein involved, it is intended that all matter contained in the above description or shown in the accompanying drawings shall be interpreted as illustrative and not in a limiting sense.

The invention claimed is:

1. An enclosure for electronic assemblies having a front region, a back region, a top, a bottom, a right side, a left side, and an interior region, comprising:
   one or more forward, rigid, zig-zag configured, generally open mesh structure stabilization frames extending across said front region, between said right and left sides at respective forward connection ends and defining one or more airflow passageways;
   one or more rearward, rigid zig-zag configured, generally open mesh structure stabilization frames extending across said back region between said right and left sides at respective rearward connection ends, and defining one or more airflow passageways;
   a right sheet metal assembly defining said right side fixed to and supported by said one or more forward structure stabilization frames at the forward connection ends thereof, and fixed to and supported by said one or more rearward structure stabilization frames at the rearward connection ends thereof;
   a left sheet metal assembly defining said left side fixed to and supported by said one or more forward structure stabilization frames at the forward connection ends thereof, and fixed to and supported by said one or more rearward structure stabilization frames at the rearward connection ends thereof;
   said one or more forward structure stabilization frames is configured exhibiting one or more generally triangular cross-sections each with an inwardly depending apex region and oppositely disposed sides extending outwardly therefrom to a base region;
   a top sheet metal assembly removably supported at said top; and
   a bottom sheet metal assembly removably supported at said bottom.

2. The enclosure of claim 1 further comprising:
   a metal honeycomb EMI shield located at said front region and supported in airflow communication by said one or more forward structure stabilization frames adjacent said base region.

3. The enclosure of claim 1 in which:
   an upwardly disposed region of said one or more forward structure stabilization frames is configured at said apex region to support a plurality of card supporting guide components forming a side of a card cage assembly located within said interior region.

4. The enclosure of claim 1 in which:
   said one or more rearward structure stabilization frames is configured exhibiting one or more generally triangular cross-sections with an outwardly depending apex region and oppositely disposed sides extending inwardly to a base region.

5. The enclosure of claim 4 in which:
   an upwardly disposed region of said one or more rearward structure stabilization frames is configured at said base region to support a plurality of card supporting guide components forming a side of a card cage assembly located within said interior region.

6. The enclosure of claim 5 in which:
   one or more apex regions of said one or more rearward structure stabilization frames is configured at said base region to support one or more air circulation fans.

7. The enclosure of claim 6 further comprising:
   a metal honeycomb EMI shield located at said back region in airflow communication with said one or more air circulation fans.

8. The enclosure of claim 1 in which:
   said one or more forward structure stabilization frames zig-zag configuration exhibits a plurality of generally triangular cross-sections each with an inwardly depending apex region and oppositely disposed sides extending outwardly therefrom to a base region; and
   said one or more rearward structure stabilization frames comprises:
   an upper frame configured with said zig-zag configuration exhibiting at least two generally triangular cross-sections with an outwardly depending apex region and oppositely disposed sides extending inwardly to a base region; and a lower frame configured with said zig-zag configuration exhibiting one or more generally triangular cross-sections with at least two outwardly depending apex regions and oppositely disposed sides extending inwardly to a base region; and said lower frame is spaced from said upper frame to define an access opening.

9. The enclosure of claim 8 in which:
said one or more forward structure stabilization frames and said one or more rearward structure stabilization frames are configured to support a backplane assembly within said interior generally adjacent said access opening and defining a card cage region and an oppositely disposed power supply region.

10. The enclosure of claim 9 in which:
said one or more forward structure stabilization frames are configured to support an array of card guides at the apex regions within said card cage region; and
said upper frame is configured to support a corresponding array of card guides at the base regions thereof.

11. The enclosure of claim 10 in which:
said upper frame is configured to support one or more air circulation fans at the apex regions thereof in airflow communication therewith.

12. The enclosure of claim 11 in which:
said upper frame is configured to support a metal honeycombed-type EMI shield outwardly of and in airflow communication with said circulation fans.

13. The enclosure of claim 12 in which:
said one or more forward structure stabilization frames is configured to support a metal honeycomb-type EMI shield outwardly of and in airflow communication therewith.

14. The enclosure of claim 9 in which:
said one or more forward structure stabilization frames and said lower frame are formed with corresponding support components configured to receive and support one or more power supply modules within said power supply region.

15. The enclosure of claim 14 in which:
said lower frame is configured to support one or more power supply air circulation fans in airflow communication therewith.

16. The enclosure of claim 15 in which:
said lower frame is configured to support a metal honeycomb-type EMI shield outwardly of and in airflow communication with said one or more power supply fans.

17. The enclosure of claim 16 in which:
said one or more forward structure stabilization frames is configured to support a metal honeycomb-type EMI shield outwardly of and in airflow communication therewith.

18. An enclosure assembly for electronic systems, such enclosure having a generally rectangular configuration with six side regions surmounting an interior region, comprising:
one or more rigid, zig-zag configured, generally open mesh first structure stabilization frames extending between oppositely disposed first connection ends and defining one or more airflow passages;
one or more rigid, zig-zag configured, generally open mesh second structure stabilization frames extending between oppositely disposed second connection ends and defining one or more airflow passages a first sheet metal assembly defining a said side region fixed at a first location, to and supported by one or more said first structure stabilization frames at a first connection end thereof, and at a second location spaced from said first location fixed to and supported by one or more said second structure stabilization frames at a second connection end thereof;

a second sheet metal assembly defining a said side region and located opposite said first sheet metal assembly, fixed, at a third location opposite said first location, to and supported by one or more said first structure stabilization frames at a first connection end thereof, and, at a fourth location opposite said second location, fixed to and supported by one or more said second structure stabilization frames at a second connection end thereof;

said one or more first structure stabilization frames is configured exhibiting one or more generally triangular cross-sections, each with a first apex region and oppositely disposed sides extending therefrom to a first base region; and said first and second structure stabilization frames defining a rigid core enclosure structure with said first and second sheet metal assemblies having four said side regions and two access openings at the remaining oppositely disposed two side regions.

19. The enclosure assembly of claim 18 further comprising:
a metal honeycomb EMI shield located adjacent said first structure stabilization frame and in airflow communication therewith.

20. The enclosure assembly of claim 18 in which:
at least a portion of said first structure stabilization frames is configured to support a plurality of card guide components of a card cage assembly located within said interior region.

21. The enclosure assembly of claim 18 in which:
said one or more second structure stabilization frames is configured exhibiting one or more generally triangular cross-sections, each with a second apex region and oppositely disposed sides extending therefrom to a second base region.

22. The enclosure assembly of claim 21 in which:
a metal honeycomb EMI shield located in airflow communication with said second structure stabilization.

23. The enclosure assembly of claim 21 in which:
at least a portion of said second structure stabilization frame is configured to support a plurality of card guide components of a card cage assembly located within said interior region.

24. The enclosure assembly of claim 21 in which:
at least a portion of said one or more second structure stabilization frames is configured to support one or more air circulation fans.

25. The enclosure assembly of claim 24 in which:
said air circulation fans are supported at said second apex region.

26. The enclosure assembly of claim 18 further comprising:
an EMI shielding first access cover removably mounted over a first of said two access openings.

27. The enclosure assembly of claim 26 further comprising:
an EMI shielding second access cover removably mounted over a second of said two access openings.

* * * * *